(12) United States Patent
Tsai

(10) Patent No.: US 6,518,907 B2
(45) Date of Patent: Feb. 11, 2003

(54) SYSTEM WITH HIGH-SPEED A/D CONVERTER USING MULTIPLE SUCCESSIVE APPROXIMATION CELLS

(75) Inventor: Richard H. Tsai, Pasadena, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/683,156

(22) Filed: Nov. 27, 2001

(65) Prior Publication Data

US 2002/0080055 A1 Jun. 27, 2002

Related U.S. Application Data

(60) Provisional application No. 60/253,430, filed on Nov. 27, 2000.

(51) Int. Cl.[7] .................................................. H03M 1/12
(52) U.S. Cl. ...................... 341/155; 341/122; 341/161; 341/162
(58) Field of Search ................................ 341/122, 155, 341/161, 162

(56) References Cited

U.S. PATENT DOCUMENTS

| | | | | |
|---|---|---|---|---|
| 3,597,761 A | * | 8/1971 | Fraschilla et al. | 341/156 |
| 5,247,301 A | * | 9/1993 | Yahagi et al. | 341/118 |
| 5,585,796 A | * | 12/1996 | Svensson et al. | 341/155 |
| 5,886,659 A | * | 3/1999 | Pain et al. | 341/144 |
| 6,160,508 A | * | 12/2000 | Gustavsson et al. | 341/155 |
| 6,392,575 B1 | * | 5/2002 | Eklund | 341/118 |

* cited by examiner

*Primary Examiner*—Michael Tokar
*Assistant Examiner*—Khai Nguyen
(74) *Attorney, Agent, or Firm*—Fish & Richardson P.C.

(57) ABSTRACT

An A/D conversion system for an image sensor. The image sensor acquires image signals, and outputs them to a plurality of sample and hold circuits. The sample and hold circuits are grouped and are commonly actuated, in order to simplify the control circuit. Once the signals are in the sample and hold circuits, the next clock cycle commonly actuates a plurality of A/D converters which commonly convert all of those signals. During that same clock cycle, another set of sample and hold circuits may be actuated.

33 Claims, 3 Drawing Sheets

SYSTEM WITH HIGH-SPEED A/D CONVERTER USING MULTIPLE SUCCESSIVE APPROXIMATION CELLS

CROSS REFERENCE TO RELATED APPLICATIONS

This application claims priority from provisional application No. 60/253,430, filed Nov. 27, 2000.

BACKGROUND OF INVENTION

Image sensors often use high-speed A/D converters. These converters must strike a balance between speed and power consumption. Faster converters will allow faster image acquisition. However, these often consume much more power than other, slower, converters.

A successive approximation A/D converter may represent a good trade-off between speed and power consumption. It has been suggested to use multiple successive approximation A/D converters in a pipeline type architecture. The conversion of the multiple pixels is thus pipelined, thereby increasing the overall conversion speed, while maintaining the advantageous power consumption characteristics of the successive approximation converter.

Generation of multiple timing and control signals for such a pipelined system may be complicated.

SUMMARY OF INVENTION

The present application teaches a new architecture which enables high speed A/D conversion, with multiple successive approximation cells in the conversion system.

According to an embodiment, groups of sample and hold circuits, and groups of A/D converters are controlled using a clocking scheme.

BRIEF DESCRIPTION OF DRAWINGS

These and other aspects will now be described in detail with reference to the accompanying drawings, wherein.

DETAILED DESCRIPTION

It has been suggested to generate multiple timing and control signals for multiple successive approximation A/D converters using a number of different techniques. One technique has suggested using a single clock generator, and N×K delay units, in order to obtain N sets of control signals. While this may be practical, it also represents a relatively complex circuit that needs to be implemented on the silicon substrate.

Another technique allows using N individual clock generators, to obtain N sets of control signals. This also takes a relatively larger silicon area.

The present system discloses techniques of a new architecture for forming and controlling control signals of this type. Since these techniques facilitate controlling multiple A/D converters, they effectively may increase the number of A/D converters which can be used.

The two different architecture embodiments are respectively shown in FIGS. 1 and 2.

Figure 1A:
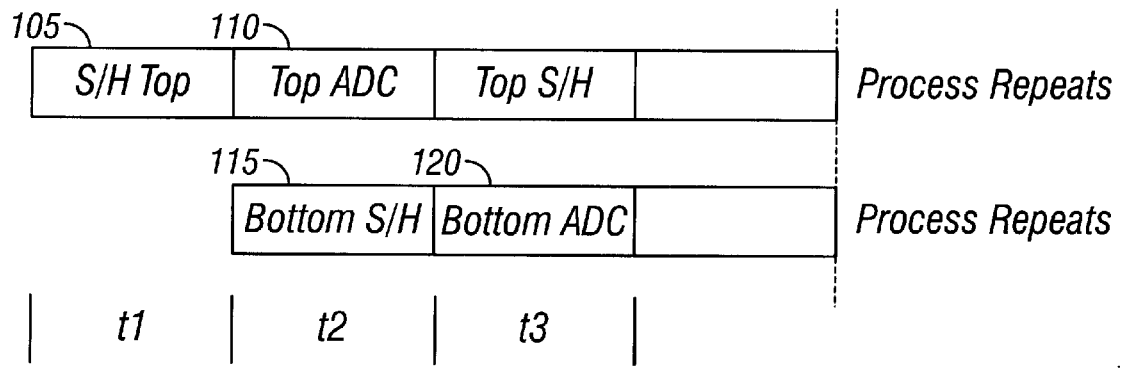
FIGS. 1A and 1B show a system using two clocks.
Figure 1B:
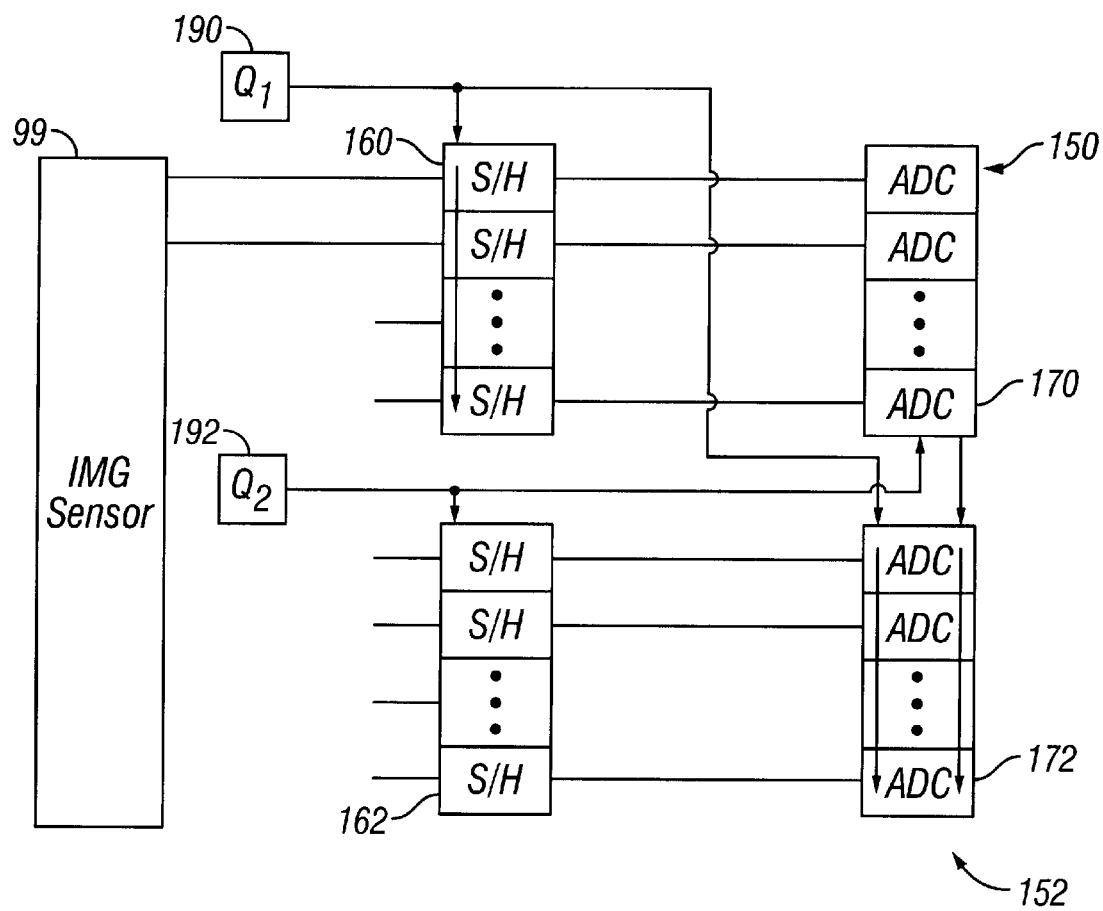

FIGS. 1A and 1B show an embodiment using two separate clock generators for two different groups of converters. This embodiment uses an image sensor 99 which includes an array of pixel based photoreceptors. Each photoreceptor receives information indicative of incoming radiation for specific pixels and produces an output signal indicative thereof. The image sensors may have any number of pixels in the array. For example, arrays of 640 by 480 are quite common.

The image sensor may be of any type, including photodiodes, photogates or any other standard type. A particularly preferred type is an active pixel sensor of a type known in the art, which is formed using MOS technology and which allows other MOS and/or CMOS circuitry to be located on the same substrate as the photoreceptor. In a preferred embodiment, all of the associated conversion circuits, clock generation circuits, and controlling circuits are located on the same semiconductor substrate as the image sensor.

In this embodiment, there are N of the successive approximation A/D converters, where N can be any number, preferably an even number, and preferably greater than 2. This system may have maximum advantages when used with N>=4, although its simplicity advantages may obtain even more advantages when used with higher numbers of A/D converters.

Each A/D converter is associated with a respective M bit digital buffer. The digital buffers can be conceptualized as sample and hold circuits.

FIG. 1A shows the flow of the conversion, with FIG. 1B showing the hardware that is used to carry out the specific conversion. In general, the N units, where units include both A/D converters and sample and hold circuits, are divided into groups of N/2 in this embodiment. FIG. 1B shows a top group 150, and the bottom group 152. Each of the elements in these respective groups are controlled commonly by clock signals. The two different clock generation units 190, 192 are actuated 180 degrees out of phase as described herein.

During the time period T1, an N/2 group of the signals are sampled and held by the first group of sample and hold units 160; shown as 105 in FIG. 1a.

During the next time period T2, the first N/2 signals which were sampled and held at 105, are subsequently coupled to a respective group of A/D converters 170. At 110, the top group of A/D converters 170 converts each of the signals from the group of sample and hold circuits 160.

During this same period T2, a group of pixel signals are respectively applied to the bottom set of sample and hold circuits 162, at 115.

During time period T3, the cycle continues. New signals are sent to the top group 160 of sample and hold circuits at 118. Substantially simultaneously, at 120, the bottom group of A/D converters 172 convert the signals that were sampled and held by circuits 162, at 115.

This same technique may repeat indefinitely. In general, during each of a plurality of clock cycles, one set of sample and hold signals receive their signals, while another set of A/D converters carry out a conversion. This may have the effect of speeding up the conversion speed by N2, where N is the number of A/D converters and sample and hold circuits. However, this is done requiring only two separate clock generators. As shown, the clock generator 190 is connected in common to both the first set of sample and hold circuits 160, and to the second set of A/D converters 172. Analogously, the second clock generator 192 is connected to the second set of sample and hold circuits 162, and to the first set of A/D converters 170.

This first embodiment may speed up conversion by a factor of N2.

A similar technique may be used with three separate clock generators. This technique, like the technique in FIG. 1, uses N successive approximation cells, and N of the M bit buffers or sample and hold circuits. In this system, however, the operation is divided into three offset clock cycles. During the different clock cycles, the information is successively gathered, (into the sample and hold circuits) and then converted. This is done in three separate cycles. This embodiment may speed up the operation by a value of 2N/3.

In this embodiment, the total N devices are divided into three different groups, each having N/3 of the components. That is, there is a first group 250 of N/3 sample and hold circuits. A second group 252, and a third group 254 similarly each have N/3 sample and hold circuits. Each of the sample and hold circuits is coupled to a respective A/D converter. The A/D converters are similarly divided into first, second and third groups 260, 262, 264 of the A/D converters.

Figure 2A:
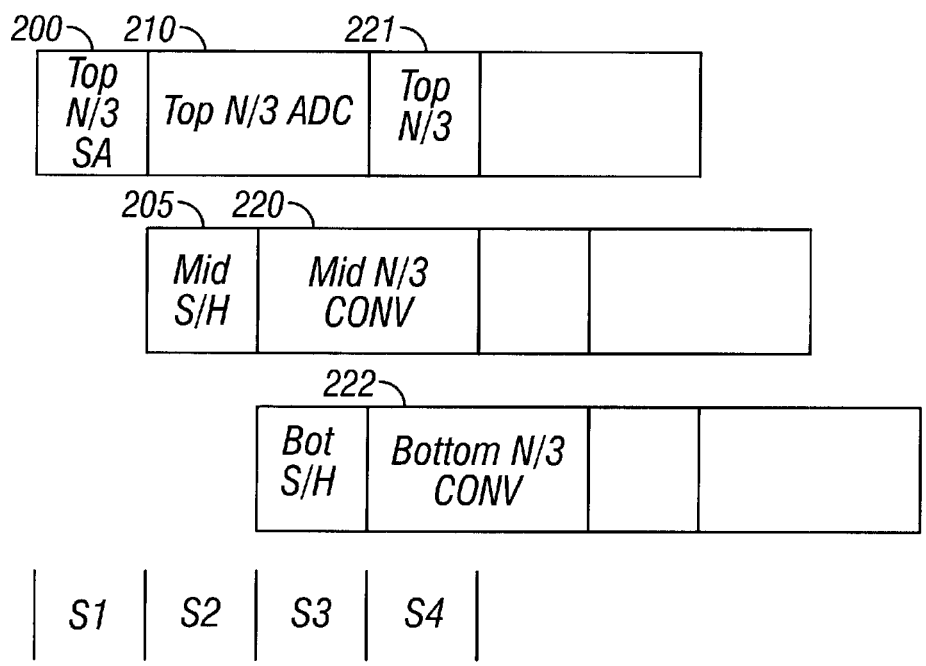
FIGS. 2A and 2b show a 3 clock system.
Figure 2B:
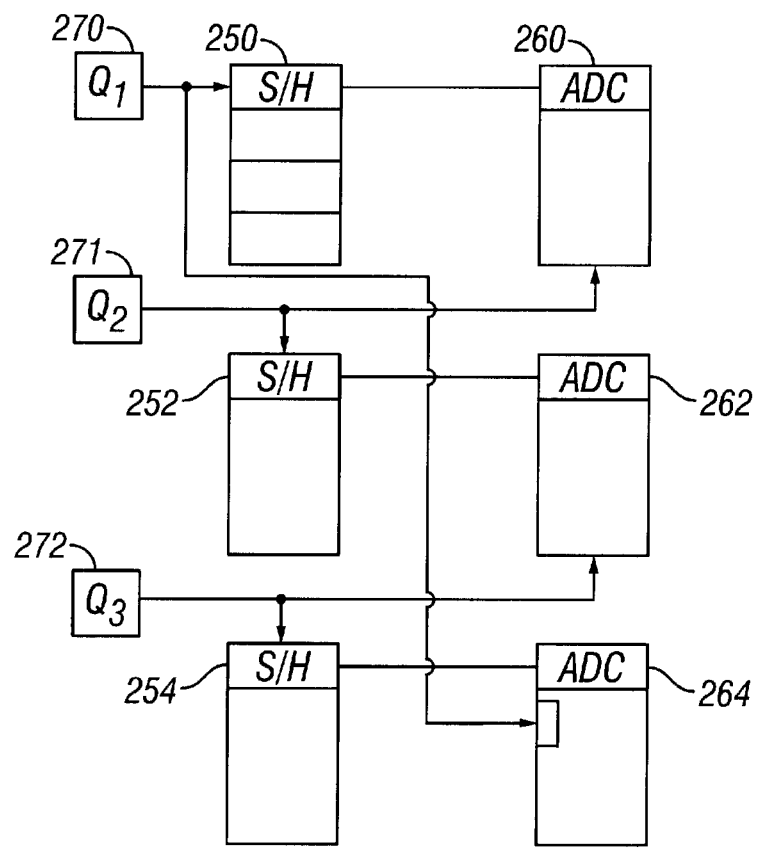

FIG. 2A shows the first time period S1 representing the cycle 200. During this cycle, at 200, the top N/3 sample and hold circuits 250 receives their signals.

Note that in this embodiment, the conversion cycles need not be equal in length. For example, the A/D converters may require more time to convert then the sample and hold circuits.

In this embodiment, the three clock generation units 270, 271, 272 may be actuated 120 degrees out of phase from one another.

During the next clock cycle S2, the middle set of sample and hold circuits 252 may receive their signals at 205. At the same time, the top bank of A/D converters 260 begin their conversion at 210.

The next clock cycle is shown as S3, the bottom sample and hold circuits 254 receive their signals at 215. The top A/D converters are still converting as part of cycle 210. During the cycle S3, also, the sample and hold carried out at 205 is complete. Hence, the signals from sample and hold block 252 are received at 205 and then coupled to the A/D converter block 262, the mid N/3 of the A/D converters. These begin their conversion at 220.

The cycle continues during clock pulse S4, in which the top sample and hold circuits 250 receive new signals at 221, the mid A/D converters are still converting as part of cycle 220, and the bottom A/D converter block 264 begins converting at 222.

In the above embodiments, the structure may be simplified, because fewer clock generators may be necessary. For example, FIGS. 1A, 1B, 2A and 2B, require only two or three clock generators. Signal routing is also simplified, because the groups of cells, such as the successive approximation cells, share the same control signals.

In the FIGS. 1A/1B embodiment, all of the N2 successive approximation cells share the same control signals. That is, the top group of cells 170 share the common control signals.

Figure 3:
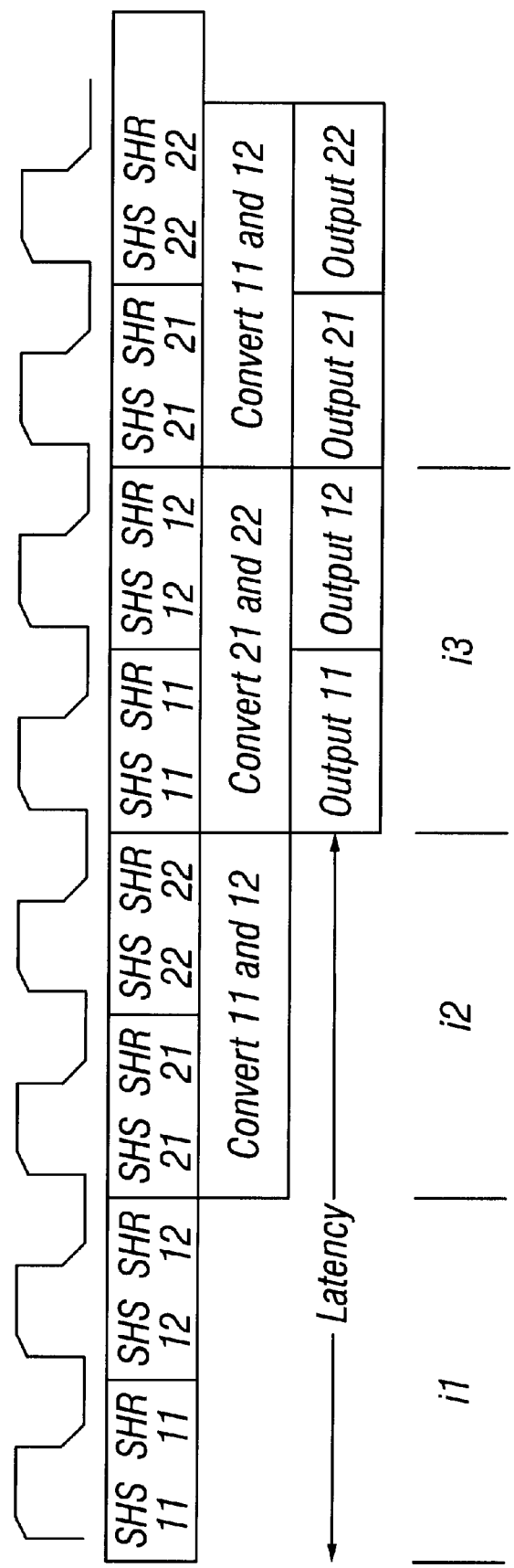
FIG. 3 illustrates system latency.

A timing diagram for the FIGS. 1A/1B embodiment is shown in FIG. 3. During a first time interval i1, the data is assembled for a number of the signals, such as 11 and 12. Each cycle of assembling data comprises obtaining the signal value and obtaining the reset value.

During a subsequent cycle i2, the two values 11 and 12 are converted. This is the time during which the A/D converter converts these values. The data is successively output during i2. FIG. 3 shows outputting 11 followed by outputting 12. Hence, the time interval i1+i2 corresponds to a measure of latency in the system.

For a master clock of 40 MHz, and an A/D converter output of 40 megasamples per second, successive approximation cells may carry out conversion at 2 megasamples per second, assuming 40 cells. In this system, two clock generator blocks are used for the FIG. 1 technique, or three clock generator blocks are used for the FIG. 2 technique. Improved results may be obtained from this system.

Although only a few embodiments have been disclosed in detail above, it should be understood as the other modifications are possible. For example, using the same general technique, the conversions may be separated into any number of divisions may be possible. Each additional clock generator may add additional complexity to the system, but has the advantage of speeding up the system. However, this may also speed up the system. Therefore, more generally there may be N total ADCs, and N total buffers. There are x groups of ADCs and buffers, and x of the clock generators, where x can be any number greater than or equal to 2. The clock generators are actuated 360/x degrees out of phase with one another. The speed increase is proportional to the number x.

What is claimed is:

1. A conversion system, comprising:

a plurality of sample and hold circuits;

a plurality N of A/D converters;

a plurality N of clock generation units, each clock generation unit producing a clock which is commonly connected to a group of said A/D converters and a group of said sample and hold circuits, and connected such that a first group of said A/D converters and a first group of said sample and hold circuits is actuated at a different time than a second group of said A/D converters and a second group of said sample and hold circuits, wherein there are x of said clock generation units, and said groups of sample and hold circuits and A/D converters each have N/x separate elements, each element capable of separately holding a signal.

2. A conversion system, comprising:

a plurality of sample and hold circuits;

a plurality N of A/D converters;

a plurality N of clock generation units, each clock generation unit producing a clock which is commonly connected to a group of said A/D converters and a group of said sample and hold circuits, and connected such that a first group of said A/D converters and a first group of said sample and hold circuits is actuated at a different time than a second group of said A/D converters and a second group of said sample and hold circuits, wherein there are two of said clock generation units, and there are N2 sample and hold units in each group of sample and hold units, and there are N/2 A/D converters in each of said group of A/D converters.

3. A conversion system, comprising:

a plurality of sample and hold circuits;

a plurality N of A/D converters;

a plurality N of clock generation units, each clock generation unit producing a clock which is commonly connected to a group of said A/D converters and a group of said sample and hold circuits, and connected such that a first group of said A/D converters and a first group of said sample and hold circuits is actuated at a different time than a second group of said A/D converters and a second group of said sample and hold circuits, wherein said two clock generation units are actuated 180 degrees out of phase with one another.

4. A conversion system, comprising:

a plurality of sample and hold circuits;

a plurality N of A/D converters;

a plurality N of clock generation units, each clock generation unit producing a clock which is commonly connected to a group of said A/D converters and a group of said sample and hold circuits, and connected such that a first group of said A/D converters and a first group of said sample and hold circuits is actuated at a different time than a second group of said A/D converters and a second group of said sample and hold circuits, wherein there are three of said clock generation units, and there are N/3 sample and hold units in each group of sample and hold units and N/3 A/D converters in each group of A/D converters.

5. A conversion system, comprising:

a plurality of sample and hold circuits;

a plurality N of A/D converters;

a plurality N of clock generation units, each clock generation unit producing a clock which is commonly connected to a group of said A/D converters and a group of said sample and hold circuits, and connected such that a first group of said A/D converters and a first group of said sample and hold circuits is actuated at a different time than a second group of said A/D converters and a second group of said sample and hold circuits, wherein said clock generation units are actuated 120 degrees out of phase with one another.

6. A conversion system, comprising:

a plurality of sample and hold circuits;

a plurality N of A/D converters;

a plurality N of clock generation units, each clock generation unit producing a clock which is commonly connected to a group of said A/D converters and a group of said sample and hold circuits, and connected such that a first group of said A/D converters and a first group of said sample and hold circuits is actuated at a different time than a second group of said A/D converters and a second group of said sample and hold circuits, wherein said group of sample and hold circuits are activated for a time period which is similar to that of a time period of actuation for said group of A/D converters.

7. A conversion system, comprising:

a plurality of sample and hold circuits;

a plurality N of A/D converters;

a plurality K of clock generation units, each clock generation unit producing a clock which is commonly connected to a group of said A/D converters and a group of said sample and hold circuits, and connected such that a first group of said A/D converters and a first group of said sample and hold circuits is actuated at a different time than a second group of said A/D converters and a second group of said sample and hold circuits, wherein said A/D converters are actuated for a time longer than the time of actuation of said group of sample and hold circuits.

8. A method, comprising:

obtaining a plurality of digital values representing signal levels of pixels from image sensors;

storing said plurality of digital values into a group of buffers, wherein said group has more than two buffers, using a first common clock to store each of said plurality of digital values into each of said group of buffers;

converting each of said values from said groups of buffers at a substantially common time, using a second common clock which is offset from said first common clock.

9. A method as in claim 8, wherein there are two of said common clocks, and each said group of buffers has one-half the total number of buffers in the system.

10. A method as in claim 9, wherein each of said common clocks are operated 180 degrees out of phase.

11. A method as in claim 8, wherein there are three of said common clocks, and said group of buffers each has one-third the total number of buffers in the system.

12. A method as in claim 8, wherein said buffers operate for a first operation time, and said converting operates for a second operation time different then said first operation time.

13. An image sensor system, comprising:

an image sensor array, producing output signals indicative of pixels of an image being obtained;

a plurality of sample and hold circuits, each formed on the same semiconductor substrate as said image sensor array;

a plurality of A/D converters, each formed on the same semiconductor substrate as said image sensor array;

a controlling element, including a plurality of clock generator elements, said controlling element controlling said plurality of sample and hold circuits and said plurality of A/D converters in respective groups, where a number of sample and hold circuits or A/D converters in each group is less than a total number of elements, said controlling including supplying a clock signal in common to each respective group, said clock signal being supplied in common to a first group of sample and hold circuits, and to a first group of the A/D converters at the same time.

14. A system as in claim 13, wherein said image sensor element includes an active pixel sensor.

15. A system as in claim 13, wherein said A/D converters are successive approximation type A/D converters.

16. A system as in claim 15, wherein there are two of said groups, each of said groups having half the total number of A/D converters, and half the total number of sample and hold circuits, and there are two separate clock generation units, each producing a clock which is commonly sent to one of said groups of sample and hold circuits, and another of said groups of A/D converters.

17. A system as in claim 15, wherein there are three of said groups, each of said groups having one-third the total number of A/D converters, and one-third the total number of sample and hold circuits, and wherein there are three of said clock generation units.

18. A method, comprising:

acquiring an array of signals representing an image; and converting a group of said signals at a common time by first sampling and holding said group of signals at a first common time and second A/D converting said signals at a second common time, and outputting digital equivalents of said array of signals at a third time after said first and second times.

19. A method as in claim 18, wherein said acquiring comprises acquiring said signals using a CMOS image sensor.

20. A method as in claim 18, wherein said A/D converting comprises carrying out a successive approximation A/D conversion.

21. A system, comprising:

an array of photoreceptors;

a plurality of clock generators, each producing a clock signal;

a plurality of sample and hold circuits, arranged into at least two groups, having a first group which is actuated by a first clock signal for all of said plurality of sample and hold circuits to operate at a first time, wherein there are greater than two sample and hold circuits in each of said groups, and each of said sample and hold circuits in said group are actuated in common by said first clock signal;

a plurality of successive approximation A/D converters, arranged into said at least two groups, and also including a first group with greater than two A/D converters in said first group, and each of said A/D converters in said first group being actuated by said first clock signal to operate at said first time.

22. A system as in claim 21, wherein there are two of said groups, and wherein said plurality of clock generators comprise first and second clock generators, respectively producing said first clock signal and of second clock signal, which are produced in common for a plurality of said elements.

23. A system as in claim 21, wherein there are three of said groups, and wherein said plurality of clock generators comprise first, second, and third clock generators, respectively producing said first, second and third clock signals, produced in common for groups of said elements.

24. An image sensor processing system, comprising:

a first plurality of sample and hold circuits, which respectively receive image signals during the first clock cycle;

a second plurality of sample and hold circuits, which respectively receive image signals during a second clock cycle, which is offset from said first clock cycle;

a first plurality of A/D converters, receiving signals from said first plurality of sample and hold circuits, during said second clock cycle, and converting said signals during said second clock cycle; and a second plurality of A/D converters, receiving signals from said second plurality of sample and hold circuits during a clock cycle subsequent two said second clock cycle, and converting said signals to digital during said subsequent clock cycle.

25. A system as in claim 24, wherein said A/D converters are successive approximation A/D converters.

26. A system as in claim 25, wherein there are x groups of A/D converters which are commonly controlled, x groups of buffers which are commonly controlled, and x of said clock generators.

27. A system as in claim 26, wherein x=2.

28. A system as in claim 24, further comprising a plurality of clock generators, each producing one of said clocks.

29. A system as in claim 26, wherein x=3.

30. An image sensor system, comprising:

a source of image signals, producing image signals respectively representing an array of image sensors;

a plurality of A/D converters;

a plurality of digital buffers;

a first clock generator which is connected in common to both a first group of said digital buffers and a second group of said A/D converters, and a second clock generator which is connected in common to a second group of said digital buffers and a first group of said A/D converters, wherein said first and second groups include different digital buffers and A/D converters.

31. A system as in claim 30, wherein said A/D converters are successive approximation type A/D converters.

32. A system as in claim 30, further comprising another group of digital buffers and another group of A/D converters, and another clock generator which is connected in common to said another group of digital buffers and said another group of said A/D converters.

33. A system as in claim 30, wherein each of said groups has more than two A/D converters and/or digital buffers within the group.

* * * * *

UNITED STATES PATENT AND TRADEMARK OFFICE
CERTIFICATE OF CORRECTION

PATENT NO. : 6,518,907 B2
DATED : February 11, 2003
INVENTOR(S) : Richard H. Tsai It is certified that error appears in the above-identified patent and that said Letters Patent is hereby corrected as shown below:

<u>Column 2,</u>
Line 21, reads "simplicity advantages may" should read-- simplicity may --.

<u>Column 3,</u>
Line 20, reads "circuits 250 receives" should read -- circuits 250 receive --.
Line 23, reads "then" should read -- than --.

<u>Column 4,</u>
Lines 6-20, paragraph should read as follows:

-- Although only a few embodiments have been disclosed in detail above, it should be understood that other modifications are possible. For example, using the same general technique, it may be possible to separate the conversions into any number of divisions. Each additional clock generator may add additional complexity to the system, but also has the advantages of speeding up the system. Therefore, more generally there may be N total ADCs, and N total buffers. There are x groups of ADCs and buffers, and x of the clock generators, where x can be any number greater than or equal to 2. The clock generators are actuated 360/x degrees out of phase with one another. The speed increase is proportional to the number x. --

<u>Column 5,</u>
Line 49, reads "K" should read -- N --.

<u>Column 6,</u>
Line 16, reads "then" should read -- than --.

UNITED STATES PATENT AND TRADEMARK OFFICE
CERTIFICATE OF CORRECTION

PATENT NO.    : 6,518,907 B2
DATED         : February 11, 2003
INVENTOR(S)   : Richard H. Tsai It is certified that error appears in the above-identified patent and that said Letters Patent is hereby corrected as shown below:

<u>Column 8,</u>
Line 3, reads "two" should read -- to --.

Signed and Sealed this

Twenty-ninth Day of April, 2003

JAMES E. ROGAN
*Director of the United States Patent and Trademark Office*